United States Patent
Lee

(10) Patent No.: US 7,490,922 B2
(45) Date of Patent: Feb. 17, 2009

(54) INKJET PRINTING SYSTEM AND METHOD OF MANUFACTURING DISPLAY DEVICE USING THE SAME

(75) Inventor: Dong-Won Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/565,162

(22) Filed: Nov. 30, 2006

(65) Prior Publication Data

US 2007/0153056 A1   Jul. 5, 2007

(30) Foreign Application Priority Data

Jan. 4, 2006   (KR) .................. 10-2006-0000734

(51) Int. Cl.
*B41J 2/15*   (2006.01)
*B41J 2/145*   (2006.01)

(52) U.S. Cl. .......................................... 347/40; 347/47
(58) Field of Classification Search ................. 347/20, 347/40–43, 47

See application file for complete search history.

(56) References Cited

U.S. PATENT DOCUMENTS

| 5,793,392 | A   * | 8/1998 | Tschida ........................ 347/40 |
| 6,921,148 | B2 * | 7/2005 | Nakamura et al. ............. 347/40 |
| 2005/0104932 | A1 * | 5/2005 | Tsuruoka et al. .............. 347/47 |

* cited by examiner

*Primary Examiner*—Thinh H Nguyen
(74) *Attorney, Agent, or Firm*—Cantor Colburn LLP

(57) ABSTRACT

An inkjet printing system includes a stage configure to mount a substrate thereon, a head unit which drips ink onto the substrate, and a moving device which moves the head unit to predetermined positions. The head unit may include an inkjet head and a plurality of nozzles having a long tubular shape and attached to a bottom surface of the inkjet head.

20 Claims, 9 Drawing Sheets

INKJET PRINTING SYSTEM AND METHOD OF MANUFACTURING DISPLAY DEVICE USING THE SAME

This application claims priority to Korean Patent Application No. 10-2006-0000734, filed on Jan. 4, 2006, and all the benefits accruing therefrom under 35 U.S.C. § 119, the contents of which in its entirety are herein incorporated by reference.

BACKGROUND OF THE INVENTION (a) Field of the Invention

The present invention relates to an inkjet printing system and a method of manufacturing a display device using the same.

(b) Description of the Related Art

Generally, various thin film patterns of flat panel displays, such as a liquid crystal display ("LCD") and an organic light emitting diode ("OLED") display, are formed through a photolithography process. A larger-sized flat panel display necessitates an increase in a quantity of materials such as a photosensitive film applied on a substrate to form a thin film pattern. This may also increase manufacturing costs, in addition much larger manufacturing equipment that may be needed for the photolithography process.

In order to minimize the above problems, an inkjet printing system has been developed to form a thin film pattern by dripping ink. In the inkjet printing system, an inkjet head for dripping ink has a long rod-shape structure that includes a plurality of holes, i.e., nozzles, to drip ink therethrough.

However, if the concentration of ink is low, it is difficult to form a thin film having a uniform profile and thickness since the circumference of the nozzle is easily smeared with ink and the smeared ink obstructs the discharge of ink through the nozzle so that the size and direction of the ink drops are changed and the stability and/or reliability of dripping ink in its intended location significantly deteriorates. Further, if the diameter of the nozzle is too large, it is difficult to drip ink with a fine discharge causing the resolution of the thin film pattern to degrade.

BRIEF SUMMARY OF THE INVENTION

The present invention is made in an effort to provide an inkjet printing system and a method of manufacturing a display device using the same to form a thin film having a uniform profile and thickness.

An inkjet printing system according to an exemplary embodiment of the present invention includes a stage configured to have a substrate mounted thereon, a head unit for dripping ink onto the substrate, and a moving device for moving the head unit to predetermined positions. The head unit may include an inkjet head and a plurality of nozzles each having a long tubular shape and attached to a bottom surface of the inkjet head.

Fine holes may be formed on inner surfaces of the nozzles to pass the ink.

Each of the nozzles may have a tapering end and be made of carbon nanotubes, and the diameters of the nozzles may be in a range from about 1 nanometer to about hundreds of nanometers.

The substrate may be a substrate for a liquid crystal display ("LCD") or an organic light emitting diode ("OLED") display. The ink may be at least one selected from among ink for color filters, ink for organic light emitting members, and ink for metal wiring.

A partition member may be formed on the substrate to confine the dripped ink, and it may be a light blocking member of the LCD or a partition of the OLED display.

The ink for metal wiring may be ink used for at least one metal wiring selected from among gate lines, storage electrode lines, and data lines.

A method of manufacturing a display device according to an exemplary embodiment of the present invention includes disposing a head unit which includes an inkjet head and a plurality of nozzles attached to the inkjet head on a substrate, and dripping ink onto the substrate through the nozzles of the inkjet head while moving the head unit. The nozzles may have a long tubular shape and may be attached to a bottom surface of the inkjet head.

Fine holes may be formed on inner surfaces of the nozzles to pass the ink.

Each of the nozzles may have a tapering end and be made of carbon nanotubes, and the diameters of the nozzles may be in a range from about 1 nanometer to about hundreds of nanometers.

The substrate may be a substrate for an LCD or an OLED display. The ink may be at least one selected from among ink for color filters, ink for organic light emitting members, and ink for metal wiring.

A partition member may be formed on the substrate to confine the dripped ink, and it may be a light blocking member of the LCD or a partition of the OLED display.

The ink for metal wiring may be ink for at least one metal wiring selected from among gate lines, storage electrode lines and data lines.

A method of manufacturing a display device using an inkjet printing system according to an exemplary embodiment of the present invention includes forming gate lines on a substrate by discharging ink for metal wiring through nozzles of the inkjet printing system, forming a gate insulating layer and a semiconductor layer on the gate lines, forming data lines on the substrate and the semiconductor layer by discharging the ink for metal wiring through the nozzles of the inkjet printing system, forming a passivation layer which has contact holes on the data lines, and forming pixel electrodes connected to portions of the data lines on the passivation layer. The nozzles may each have a long tubular shape and be attached to a bottom surface of the inkjet head.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
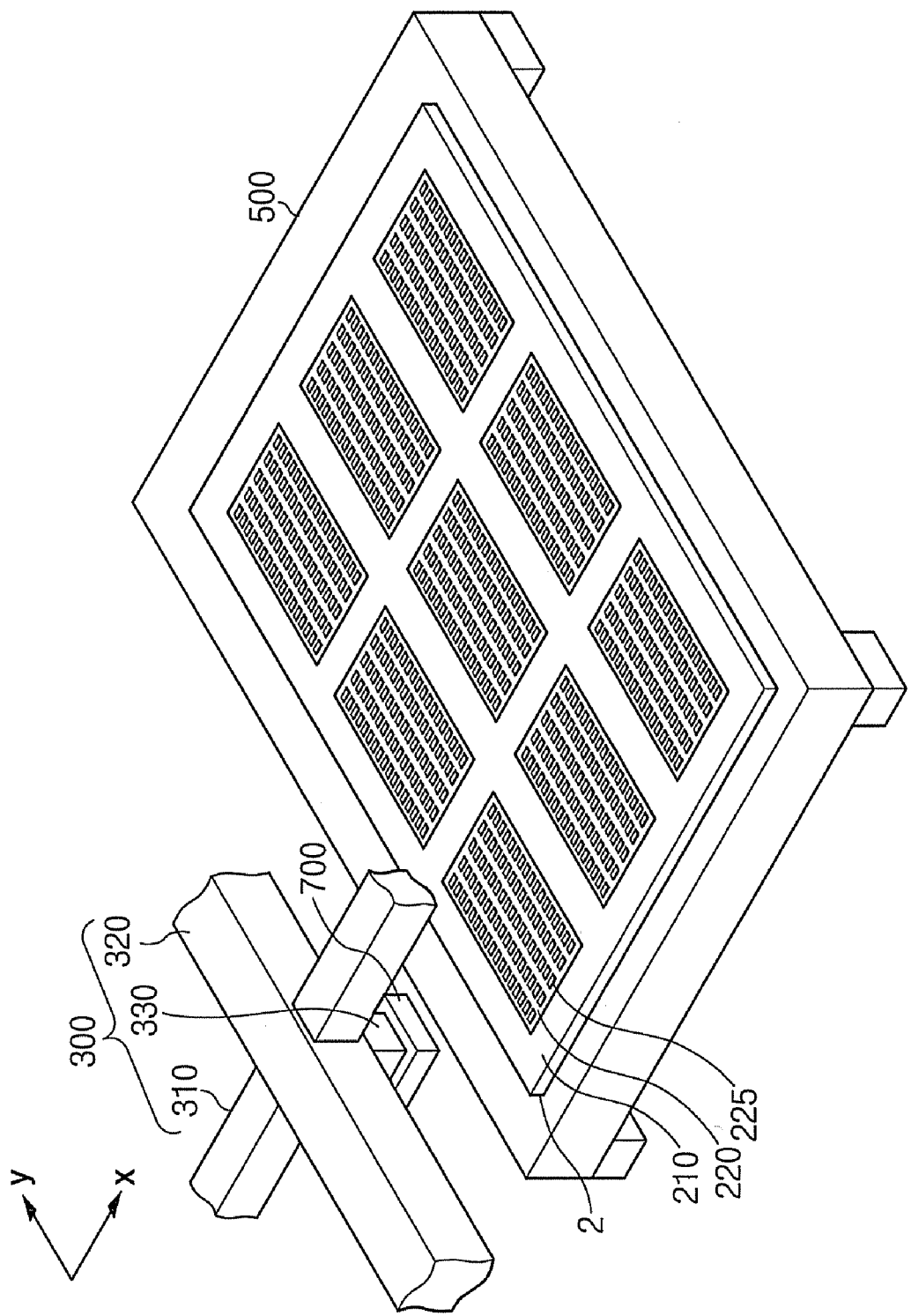
FIG. 1 is a top perspective view of an exemplary embodiment of an inkjet printing system according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

An exemplary embodiment of an inkjet printing system according to the present invention will now be described in detail with reference to FIGS. 1 to 4.

Figure 2:
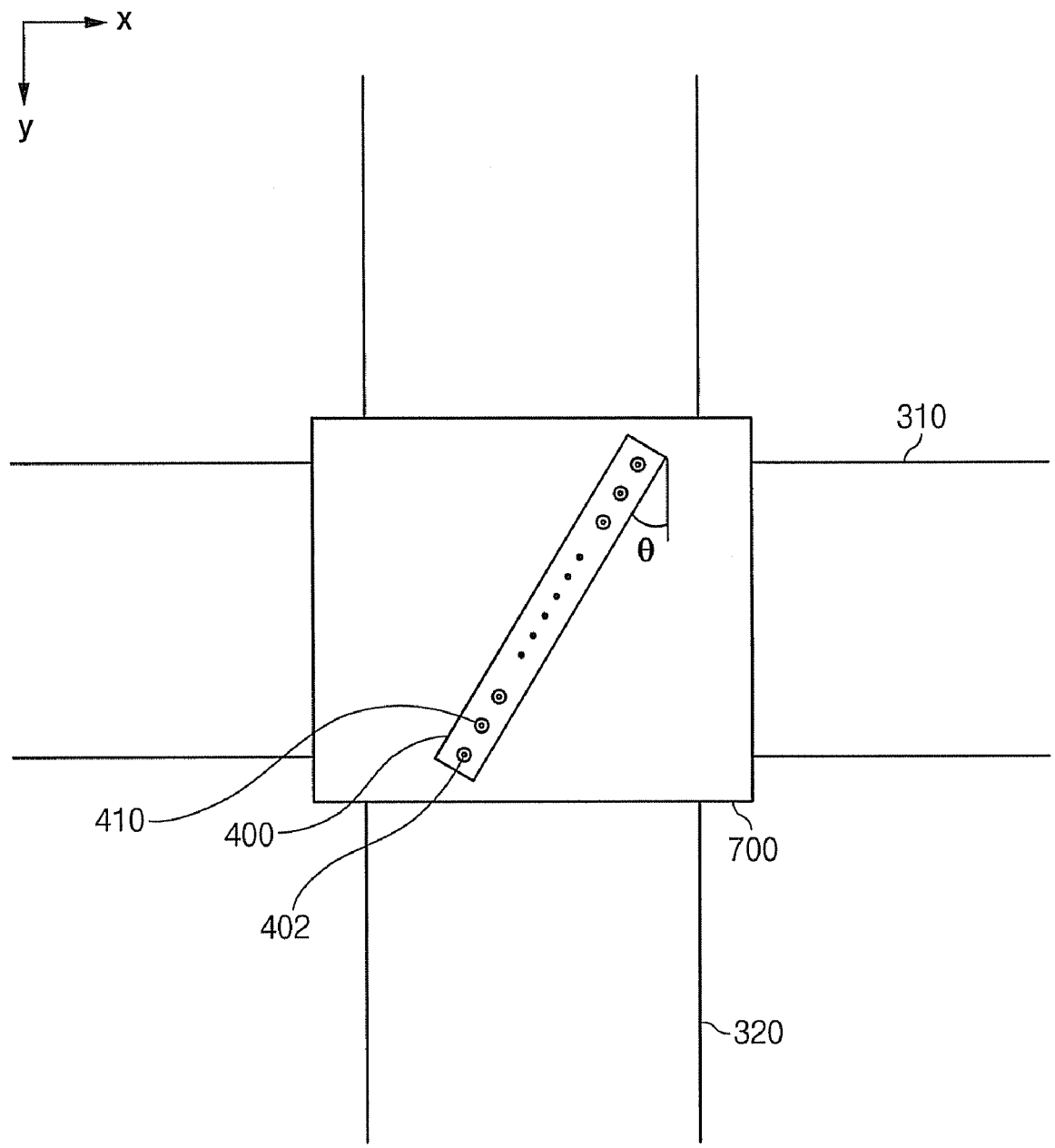
FIG. 2 is a view of an exemplary embodiment of a head unit and a moving device of an inkjet printing system as seen from below according to an the present invention.
Figure 3:
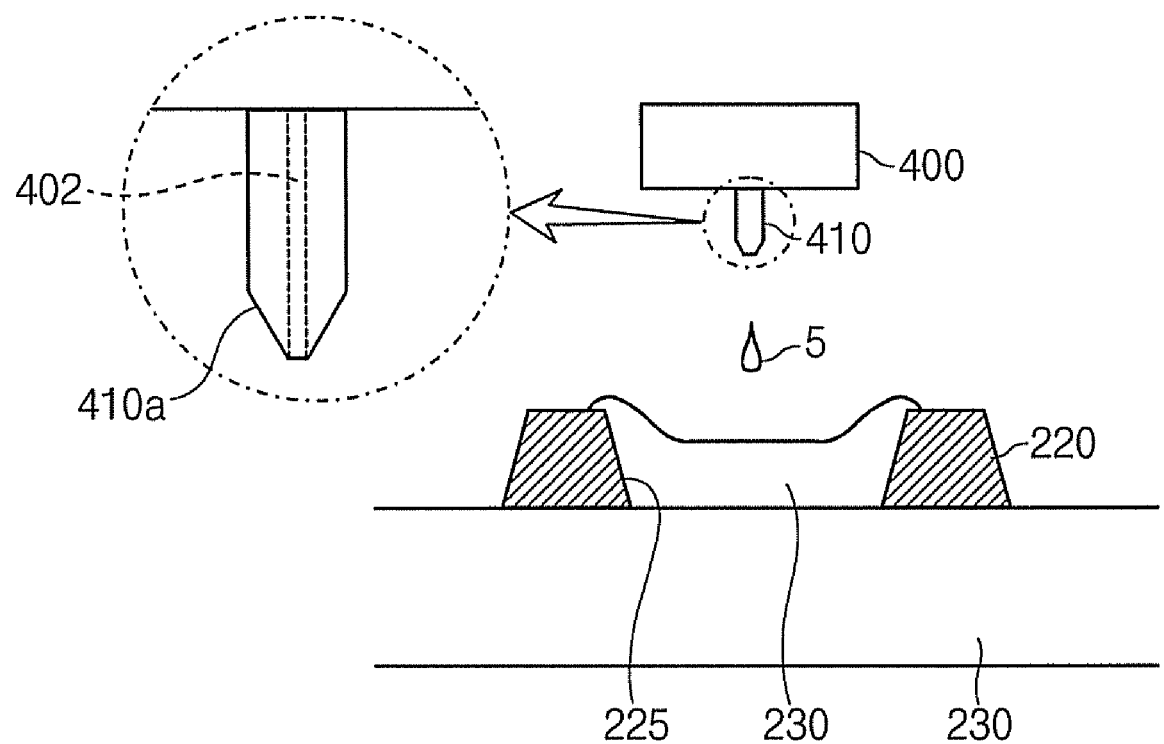
FIG. 3 is a cross-sectional view illustrating an exemplary embodiment of an ink printing method using an inkjet head of an exemplary inkjet printing system according to the present invention.
Figure 4:
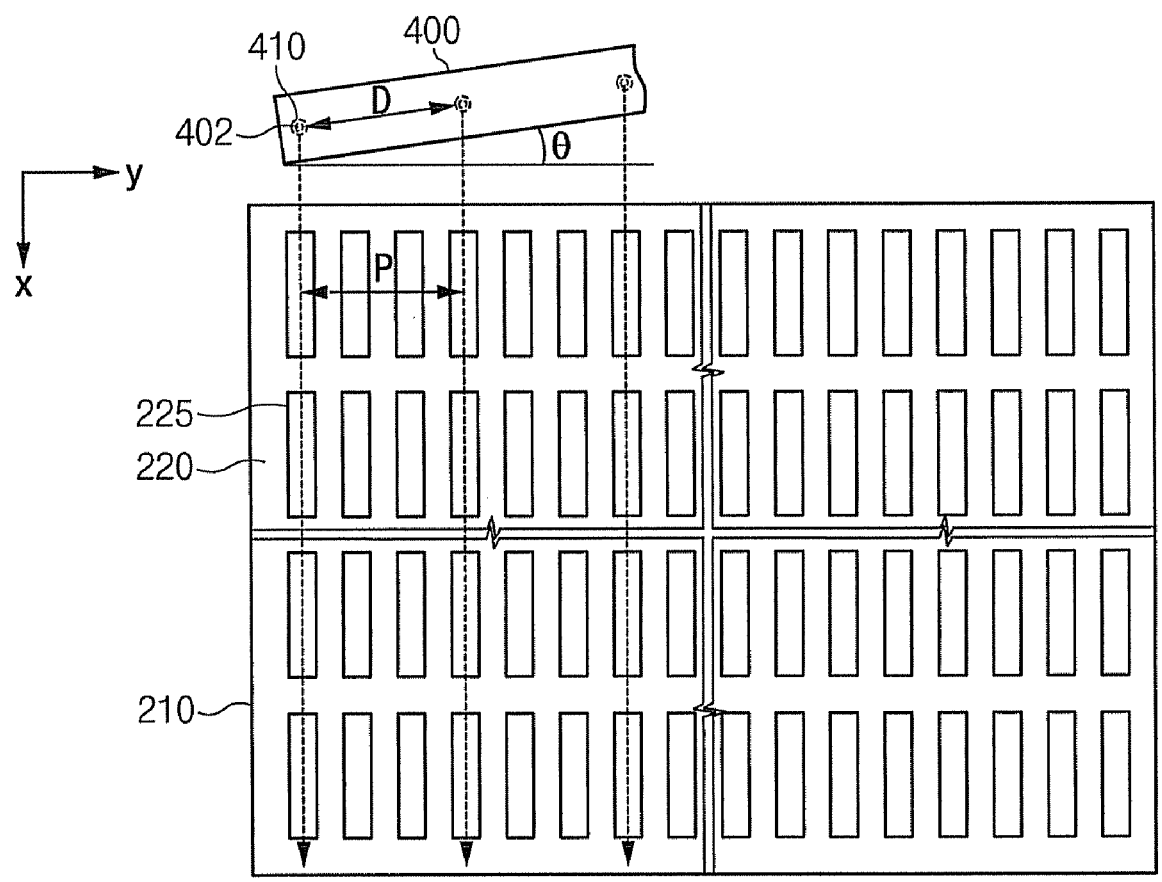
FIG. 4 is a schematic view illustrating a state of dripping ink to form color filters using an inkjet head of the exemplary inkjet printing system according to the present invention.

FIG. 1 is a top perspective view of an exemplary embodiment of an inkjet printing system according to the present invention, FIG. 2 is a view of an exemplary embodiment of a head unit, a drying unit, and a moving unit of an inkjet printing system as seen from below according to the present invention, FIG. 3 is a cross-sectional view illustrating an exemplary embodiment of an ink printing method using an inkjet head of an inkjet printing system according to the present invention, and FIG. 4 is a schematic view illustrating a state of dripping ink to form color filters using an exemplary embodiment of an inkjet head of an inkjet printing system according to the present invention.

As shown in FIGS. 1 to 4, an inkjet printing system includes a stage 500 having a mother substrate 2 mounted thereon, a head unit 700 disposed on the stage 500 by a predetermined interval, and a moving device 300 for moving the head unit 700 to predetermined positions.

In one exemplary embodiment, the stage 500 is larger than the mother substrate 2 such that it supports the mother substrate 2 thereon. The mother substrate 2 is composed of a plurality of substrates 210. The plurality of substrates 210 may be used as a supporting board such as a color filter array panel of a liquid crystal display ("LCD") or a thin film transistor array panel of an organic light emitting diode ("OLED") display.

In FIG. 1, the mother substrate 2 for forming a color filter array panel of an LCD is illustrated. As shown, and a light blocking member 220 having a plurality of openings 225 is formed on each of the plurality of substrates 210.

As shown in FIG. 2, the head unit 700 includes an inkjet head 400. The inkjet head 400 has a long rod-shape and a bottom surface with a plurality of nozzles 410 attached thereon.

Each nozzle 410 has a long tubular shape, and ink is discharged onto the substrate 210 through fine holes 402 formed on inner surfaces of the nozzles 410, as shown in FIG. 3. It is preferable that each nozzle 410 has a diameter in a range from about one nanometer to hundreds of nanometers (nm), and is made of a carbon nanotube. The carbon nanotube is a fine molecule consisting of carbon atoms that are connected with hexagonal rings formed in a long tubular shape and having a diameter of 1 nm. The tubular-shaped carbon nanotube is formed of a rolled carbon plane that has a honeycomb structure in which carbon atoms are coupled in sets of three. The carbon nanotube has a tensile strength that is 100 times greater than a tensile strength of steel, and has excellent flexibility and is lightweight because of its hollow structure.

In this case, it is possible to drip fine ink drops therethrough, and thus, form a thin film having a fine width. It is also possible to form a thin film having various patterns by adjusting the number of fine ink drops.

As shown in FIG. 3, each nozzle 410 has a tapering end 410a in order to not be smeared with the ink 5 even if the concentration of the ink 5 is low. In this case, the size and direction of the ink drops can be uniformly maintained since there are no factors for obstructing the progress of the ink 5, and therefore it is possible to form a thin film having a uniform profile and thickness.

As shown in FIG. 4, the inkjet head 400 is inclined in the Y direction at a predetermined angle θ. That is, since a nozzle pitch D, which is a distance between two adjacent nozzles 410 in the inkjet head 400, differs from a pixel pitch P, which is a distance between two pixels to be printed, the inkjet head 400 turns at the predetermined angle θ so as to match a gap between ink drops dripped from the nozzles 410 with the pixel pitch P. Although only one inkjet head 400 is shown in FIG. 2, a plurality of inkjet heads may be provided.

The moving device 300 includes a Y direction mover 310 for placing the head unit 700 above the substrate 210 with a predetermined gap and moving the head unit 700 in the Y direction, an X direction mover 320 for moving the head unit 700 in the X direction, and lifters 330 (FIG. 1) for lifting the head unit 700.

The process of forming color filters on the substrate 210 using the inkjet printing system having the above-mentioned structure will now be described.

First, the head unit 700 is disposed at a predetermined position above the substrate 210 by the operation of the X or Y direction mover 320 or 310, respectively, and lifter 330 of the moving device 300 in the inkjet printing system.

Next, the X direction mover 320 of the moving device 300 and the nozzles of the head unit 700 are driven to move the head unit 700 in the X direction while dripping the ink 5.

At this time, by using the long tubular-shaped nozzles 410, it is possible to drip ink drops having a uniform size and direction and thus to form color filters 230 that have a uniform profile and thickness.

The display panel manufactured by the inkjet printing system according to an exemplary embodiment of the present invention may be a color filter array panel of an LCD or a thin film transistor array panel of an OLED display. That is, it is possible to form color filters of a liquid crystal display or organic light emitting members of an OLED display through the inkjet printing system according to an exemplary embodiment of the present invention.

Figure 5:
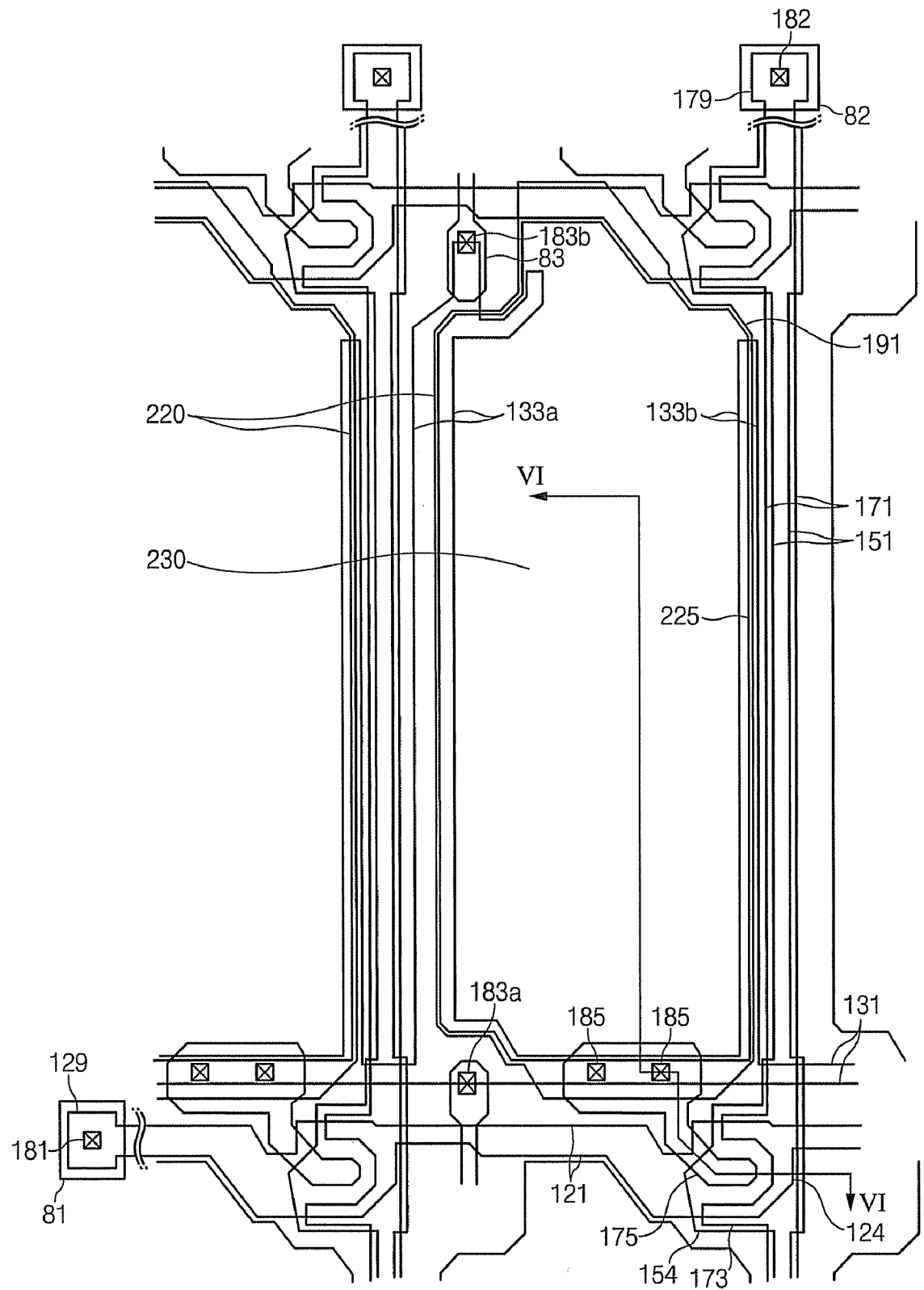
FIG. 5 is a top plan layout view of an exemplary embodiment of a liquid crystal display ("LCD") manufactured using the exemplary inkjet printing system according to the present invention.
Figure 6:
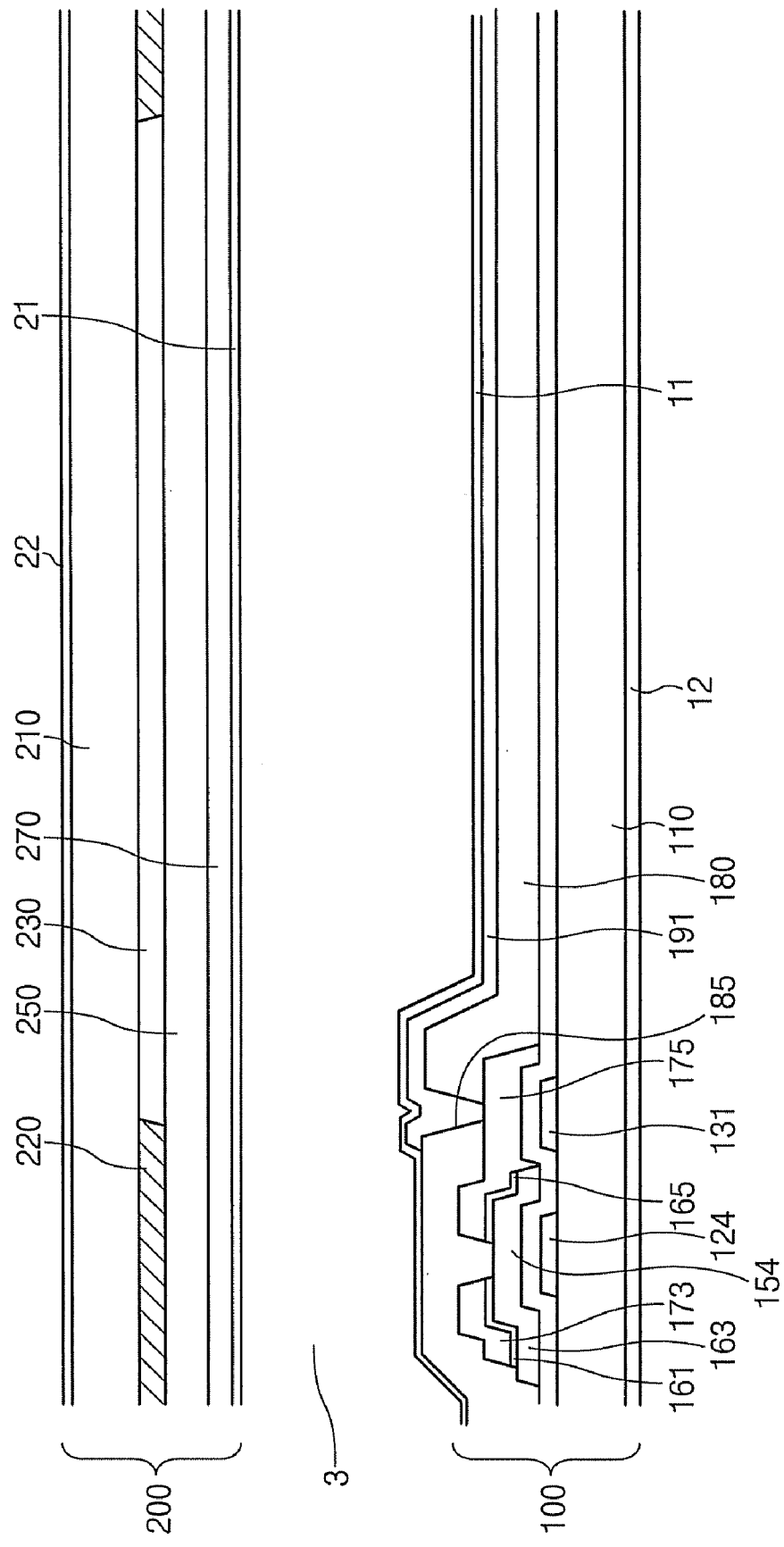
FIG. 6 is a cross-sectional view taken along line VI-VI of FIG. 5.

FIG. 5 is a plan view layout of an LCD manufactured using an inkjet printing system according to an exemplary embodiment of the present invention. FIG. 6 is a cross-sectional view taken along line VI-VI of FIG. 5. The thin film transistor array panel 100 will now be described in detail with reference to FIGS. 5 and 6.

As shown in FIGS. 5 and 6, a liquid crystal display includes a lower thin film transistor array panel 100, an upper color filter array panel 200 facing the thin film transistor array panel 100, and a liquid crystal layer 3 interposed between the thin film transistor array panel 100 and the color filter array panel 200.

A plurality of gate lines 121 and a plurality of storage electrode lines 131 are formed on an insulation substrate 110 which is made of transparent glass or plastic. The gate lines 121 transfer gate signals and extend basically in a horizontal direction, as illustrated in FIG. 5. Each of the gate lines 121 includes a plurality of gate electrodes 124 which protrude upward and downward and an end 129 of which area is widened to connect with another layer or external driving circuit (not shown). The storage electrode lines 131 receive a predetermined voltage, and have trunk lines extending to run substantially parallel to the gate lines 121 and a plurality of pairs of first and second storage electrodes 133a and 133b branching off from the trunk lines. Each of the storage electrode lines 131 is disposed between two adjacent gate lines 121, and the trunk line is placed closer to the lower one of the two gate lines 121.

A gate insulating layer 140 made of silicon nitride ("SiNx") or silicon oxide ("SiOx") is formed on the gate lines 121 and the storage electrode lines 131.

A plurality of semiconductor stripes 151 made of hydrogenated amorphous silicon (a-Si) or polysilicon are formed on the gate insulating layer 140. The semiconductor stripes 151 extend mainly in a vertical direction and have a plurality of projections 154 that protrude toward the gate electrodes 124, as illustrated in FIG. 5. The semiconductor stripes 151 become wider around the gate lines 121 and the storage electrode lines 131 so as to cover them.

A plurality of ohmic contact stripes and islands 161 and 165 are formed on the semiconductors 151, as illustrated in FIG. 6. Exemplary embodiments of the ohmic contacts 161 and 165 may be made of silicide or n+ hydrogenated amorphous silicon in which n-type impurities such as phosphorus are highly doped. The ohmic contact stripes 161 have a plurality of projections 163, and the projections 163 and the ohmic contact islands 165 form pairs to be disposed opposite one another on the projections 154 of the semiconductors 151.

A plurality of data lines 171 and a plurality of drain electrodes 175 are formed on the ohmic contacts 161 and 165 and the gate insulating layer 140.

The data lines 171 transfer data signals and extend mainly in a vertical direction to cross the gate lines 121. The data lines 171 also cross the storage electrode lines 131 to run between the sets of adjacent storage electrode branches 133a and 133b. Each of the data lines 171 has a plurality of source electrodes 173 extending toward the gate electrodes 124 and a wide end 179 which may be used for connecting with another layer or an external driving circuit (not shown).

The drain electrodes 175 are separated from the data lines 171 and face the source electrodes 173 with the gate electrodes 124 as a center. Each of the drain electrodes 175 has one wide end and one rod-shape or narrower projecting end. The wide ends are overlapped with the storage electrode 137, and the rod-shape ends are partially surrounded by the source electrodes 173 projecting from the data line 171.

A thin film transistor ("TFT") is made of one gate electrode 124, one source electrode 173, and one drain electrode 175 together with the projection 154 of the semiconductor 151, and the channel of the TFT is formed on the projection 154 between the source electrode 173 and the drain electrode 175.

The ohmic contacts 161 and 165 are placed between the semiconductors 151 and the data lines 171 and drain electrodes 175 to reduce the resistance therebetween.

A passivation layer 180 is formed on the data lines 171, the drain electrodes 175, and exposed portions of the semiconductor stripes 151 and projections on the semiconductor stripes 154. Exemplary embodiments of the passivation layer 180 may be made of an inorganic insulator or an organic insulator, and its surface may be flat.

A plurality of contact holes 181, 182 and 185 are formed in the passivation layer 180 to expose the ends 179 of the data lines 171, the ends of the gate lines 129 and the drain electrodes 175. A plurality of contact holes 181 are formed in the passivation layer 180 and the gate insulating layer 140, to expose the ends 129 of the gate lines 121, a plurality of contact holes 183a are formed to expose parts of the storage electrode lines 131 around base ends of the first storage electrodes branches 133a, and a plurality of contact holes 183b are formed to expose projections of the ends of the first storage electrode branches 133a opposite the base ends.

A plurality of pixel electrodes 191, a plurality of overpasses 83, and a plurality of contact assistants 81 and 82 are formed on the passivation layer 180.

The pixel electrodes 191 are physically and electrically connected to the drain electrodes 175 through the contact holes 185, and receive data voltages from the drain electrodes 175. The pixel electrodes 191 to which a data voltage is applied generate electric fields together with a common electrodes 270 of the display panel 200 to which a common voltage is applied so as to determine the orientation of liquid crystal molecules of the liquid crystal layer 3 between the pixel electrodes 191 and the common electrode 270. The polarization of light which passes through the liquid crystal layer varies depending on the orientation of the liquid crystal molecules. The pixel electrodes 191 and the common electrode 270 form capacitors (hereinafter, referred to as liquid crystal capacitors) to maintain the applied voltage even after the thin film transistor is turned off.

The pixel electrodes 191 and the drain electrodes 175 connected to the pixel electrodes 191 are overlapped with the storage electrodes 133a and 133b and the storage electrode lines 131.

Capacitors formed by overlapping the pixel electrodes 191 and the drain electrodes 175 which are electrically connected to the pixel electrodes 191 with the storage electrode lines 131 are referred to as storage capacitors, and they enhance the voltage maintaining ability of the liquid crystal capacitors.

The contact assistants 81 and 82 are connected to the wide ends 129 of the gate lines 121 and the wide ends 179 of the data lines 171 through the contact holes 181 and 182, respectively. The contact assistants 81 and 82 supplement the connectivity of the ends 129 of the gate lines 121 and the wide ends 179 of the data line 171 to an external device and also may function to protect them from corrosive substances or abrasion.

The overpasses 83 are laid across the gate lines 121 and connected to the portions of the storage electrode lines 131 which are exposed by the contact hole 183a and the free ends of the storage electrodes 133b which are exposed by the contact hole 183b with the gate lines 121 placed therebetween. The storage electrodes 133a and 133b and the storage electrode lines 131 may be used together with the overpasses 83 to compensate for defects of the gate lines 121, the data lines 171, or the thin film transistors.

A method of manufacturing the upper color filter array panel shown in FIGS. 5 and 6 will now be described in more detail with additional reference to FIGS. 1-4.

The gate lines 121 and the storage electrode lines 131 are formed by dripping the ink 5 for metal wiring onto the insulation substrate 110 made of transparent glass, for example, through the long tubular-shaped nozzles 410 of the inkjet printing system according to an exemplary embodiment of the present invention. The ink 5 for metal wiring is made of an aluminum (Al) group metal including Al and an Al alloy, a silver (Ag) group metal including Ag and a Ag alloy, a copper (Cu) group metal including Cu and a Cu alloy, a molybdenum (Mo) group metal including Mo and a Mo alloy, chromium (Cr), tantalum (Ta), or titanium (Ti).

The plurality of gate lines 121 and the plurality of storage electrode lines 131 are formed by sequentially performing sputtering deposition, wet etching, and dry etching processes for a conductive layer made of an Al group metal including Al or an Al alloy, a Ag group metal including Ag or a Ag alloy, a Cu group metal including Cu or a Cu alloy, a Mo group metal including Mo or a Mo alloy, Cr, Ta, or Ti.

The plurality of intrinsic semiconductor stripes 151 including a plurality of extrinsic semiconductor stripes and the plurality of projections 154 are formed on the gate insulating layer 140 by sequentially stacking a triple layer of the gate insulating layer 140 with a thickness of about 500 Å to about 5000 Å, an intrinsic amorphous silicon layer with a thickness of about 500 Å to about 2000 Å, and an extrinsic amorphous silicon layer with a thickness of about 300 Å to about 600 Å, and performing photolithography to the extrinsic amorphous silicon layer and the intrinsic amorphous silicon layer.

The plurality of data lines 171, the plurality of drain electrodes 175, the plurality of source electrodes 173 and their ends 179 are formed by dripping the ink 5 for metal wiring through the long tubular-shaped nozzles 410 of the inkjet printing system according to an exemplary embodiment of the present invention.

The plurality of data lines 171 and the plurality of drain electrodes 175 including the plurality of source electrodes 173 and their ends 179 are formed by performing sputtering deposition for a conductive layer made of an Al group metal including Al or an Al alloy, a Ag group metal including Ag or a Ag alloy, a Cu group metal including Cu or a Cu alloy, a Mo group metal including Mo or a Mo alloy, Cr, Ta, or Ti with a thickness of about 1500 Å to about 3000 Å and patterning the deposited conductive layer.

The plurality of ohmic contact stripes 161, the plurality of ohmic contact islands 165, and the plurality of projections 163 are completed by removing the exposed portions of the extrinsic semiconductor that are not covered with the data lines 171 and the drain electrodes 175 so as to expose the portions of the intrinsic semiconductor 151 under them. In exemplary embodiments, an oxygen plasma process is performed to stabilize the surface of the exposed portions of the intrinsic semiconductors.

The plurality of contact holes 182 and 185 for exposing the ends 179 of the data lines 171 and portions of the drain electrodes 175 and the plurality of contact holes 181 for exposing the portions of the gate insulating layer 140 which are placed on the ends 129 of the gate lines 121 are formed by applying the passivation layer 180 and performing photolithography to the applied passivation layer 180.

The plurality of pixel electrodes 191 and the plurality of contact assistants 81 and 82 are formed on the passivation layer 180, the exposed portions of the ends 129 of the gate lines 121, the drain electrodes 175, and the exposed portions of the ends 179 of the data lines 171 by stacking IZO or ITO with a thickness of about 400 Å to about 500 Å through a sputtering process.

The color filter array panel 200 will now be described with continued reference to FIGS. 5 and 6.

A light blocking member 220 is formed on the insulation substrate 210 made of transparent glass or plastic. The light blocking member 220 is also called a black matrix and blocks light leakage. The light blocking member 220 has a plurality of openings 225 (FIG. 5) which face the pixel electrodes 191 and have substantially the same shape as the pixel electrodes 191, and blocks light leakage between the pixel electrodes 191. The light blocking member 220 may consist of portions corresponding to the gate lines 121 and the data lines 171 and portions corresponding to the thin film transistor. The light blocking member 220 functions as a partition member to confine ink for color filters in the manufacturing process of the color filter array panel using the inkjet printing system.

A plurality of color filters 230 formed by the inkjet printing system are placed on the openings 225 of the light blocking member 220. The color filters 230 are mainly placed in the region surrounded by the light blocking member 220 and may extend along the column of the pixel electrodes 191 in a vertical direction. Each of the color filters 230 can display one of primary colors such as red, green, and blue, for example, but is not limited thereto.

An overcoat 250 is formed on the color filters 230 and the light blocking member 220. The overcoat 250 is made of an (organic) insulator to prevent the color filters 230 from being exposed and provides a flat surface. However, the overcoat 250 may be omitted in alternative exemplary embodiments.

A common electrode 270 is formed on the overcoat 250. The common electrode 270 is made of a transparent conductor such as indium tin oxide ("ITO") or indium zinc oxide ("IZO").

Alignment layers 11 and 21 are applied on facing inner surfaces of the display panels 100 and 200, respectively, and they may be horizontal alignment layers or vertical alignment layers. Polarizers 12 and 22 are provided on external surfaces of the display panels 100 and 200, respectively. The polarization axes of the two polarizers 12 and 22 are perpendicular to each other, and it is desirable that one of the two polarization axes is parallel to the gate lines 121. In the case of a reflective liquid crystal display, it will be recognized that one of the two polarizers 12 and 22 can be omitted.

The method of manufacturing the color filter array panel illustrated in FIGS. 5 and 6 will now be described in more detail.

First, the light blocking member 220 including the plurality of openings 225 is formed by forming a metal layer, such as Cr, on the insulation substrate 210 which is made of a transparent material, such as glass, by a vacuum deposition process, and performing photolithography on the deposited metal layer. The light blocking member 220 may be formed by stacking a polymer resin solution on the insulation substrate 210 and performing spin coating and photolithography processes. Alternatively, the light blocking member 220 may be formed through various other well-known techniques.

Next, the color filters 230 are formed in the openings 225 of the light blocking member 220 by the exemplary inkjet printing system of FIGS. 1-4. That is, the color filters 230 are formed by dripping the ink 5, which is a liquid pigment paste corresponding to red, green, and blue color filters, into the openings 225 through the nozzles 410 while moving the head unit 700, to fill the openings 225. Then, the color filters 230 are completed by immediately placing a drying unit (not shown) adjacent to the head unit 700 (FIG. 1) on the dripped ink and drying the ink by vacuum and heat. Therefore, the profile and thickness of the color filters 230 become uniform.

Next, the overcoat 250 is formed on the color filters 230 and the light blocking member 220 with an (organic) insulator. Then, the common electrode 270 is formed on the overcoat 250 with a transparent conductor such as ITO or IZO.

Hereinafter, an exemplary embodiment of an OLED display manufactured using the exemplary inkjet printing system of FIGS. 1-4 according to the present invention will be described.

Figure 7:
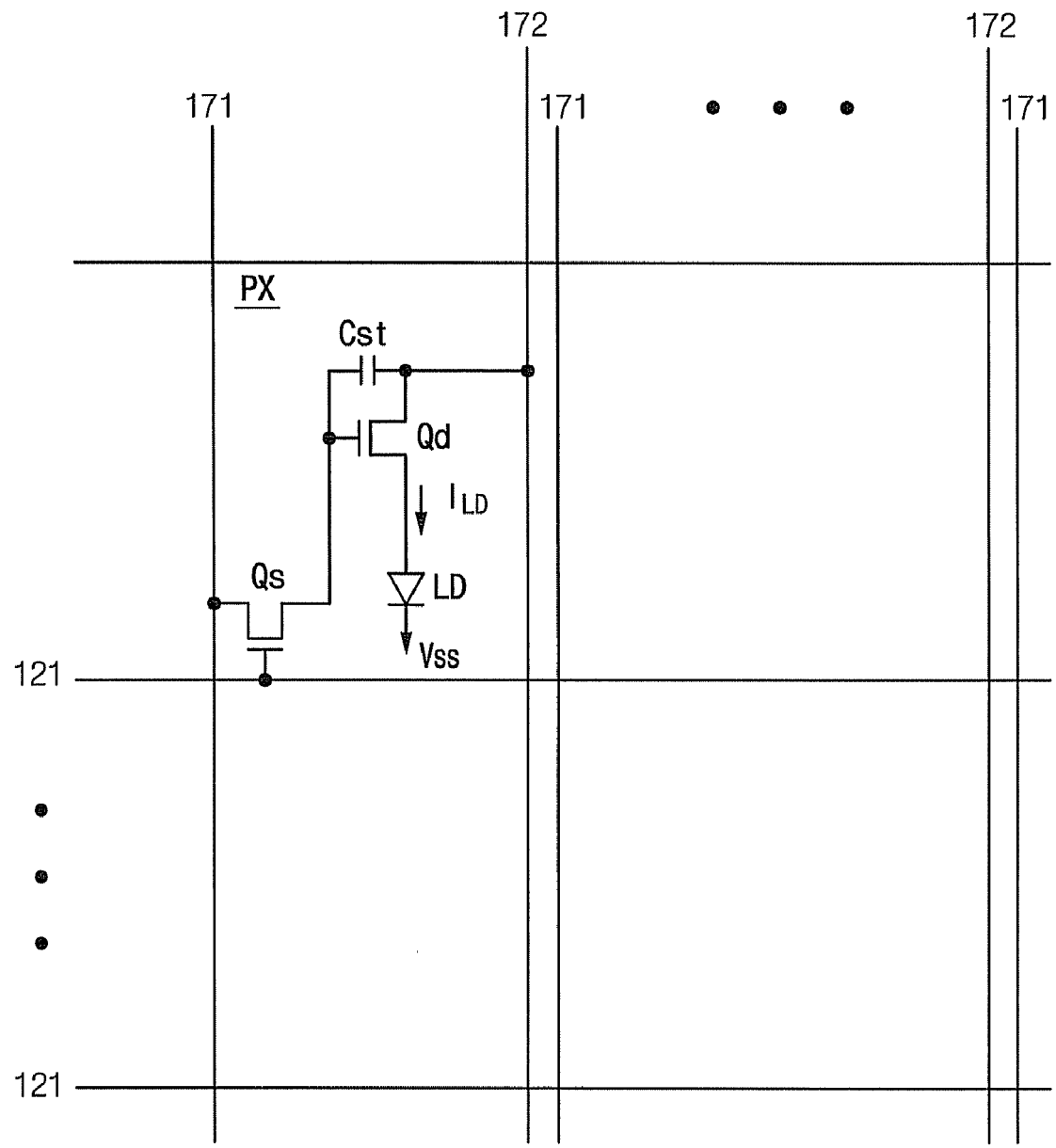
FIG. 7 is an equivalent circuit schematic diagram of an exemplary embodiment of an organic light emitting diode ("OLED") display according to the present invention.

First, an equivalent circuit of an OLED display manufactured using the exemplary inkjet printing system of FIGS. 1-4 according to the present invention will be described with reference to FIG. 7. FIG. 7 is an equivalent circuit schematic diagram of an exemplary embodiment of an OLED display according to the present invention.

Referring to FIG. 7, the exemplary OLED display manufactured using the inkjet printing system according to an exemplary embodiment of the present invention includes a plurality of signal lines 121, 171 and 172, and a plurality of pixels PX that are connected to the signal lines 121, 171 and 172 and arranged basically in a matrix.

The signal lines includes a plurality of gate lines 121 for transferring gate signals or scanning signals, a plurality of data lines 171 for transferring data signals, and a plurality of driving voltage lines 172 for transferring driving voltages. The gate lines 121 extend basically in a row direction extending substantially parallel to each other, while the data lines 171 and the driving voltage lines 172 extend basically in a column direction extending substantially parallel to each other.

Each of the pixels PX includes a switching transistor Qs, a driving transistor Qd, a storage capacitor Cst and an organic light emitting diode ("OLED") LD.

The switching transistor Qs includes a control terminal, an input terminal, and an output terminal. The control terminal is connected to the gate line 121, the input terminal is connected to the data line 171, and the output terminal is connected to the driving transistor Qd. The switching transistor Qs transfers a data signal, which is supplied to the data line 171, to the driving transistor Qd in response to a scanning signal supplied to the gate line 121.

The driving transistor Qd also includes a control terminal, an input terminal, and an output terminal. The control terminal is connected to the output terminal of the switching transistor Qs, the input terminal is connected to the driving voltage line 172, and the output terminal is connected to the OLED LD. The driving transistor Qd flows an output current $I_{LD}$ having a magnitude which varies depending on a voltage between a control terminal and an output terminal of the driving transistor Qd.

The capacitor Cst is connected between the control terminal and the input terminal of the driving transistor Qd. The capacitor Cst charges a data signal supplied to the control terminal of the driving transistor Qd and sustains the charged data signal even after the switching transistor Qs is turned off.

The OLED LD includes an anode connected to the output terminal of the driving transistor Qd, and a cathode connected to a common voltage Vss. The OLED LD emits lights with different intensities according to the output current $I_{LD}$ of the driving transistor Qd so as to display images.

The switching transistor Qs and the driving transistor Qd are n-channel electric field transistors ("FETs"). However, at least one of the switching transistor Qs and the driving transistor Qd may be a p-channel electric field transistor in alternative exemplary embodiments. Also, the connection relationships among the transistors Qs and Qd, the capacitor Cst, and the OLED LD may be different.

Hereinafter, the structure of a display panel for the OLED display shown in FIG. 7 will be described in more detail with reference to FIGS. 8 and 9.

Figure 8:
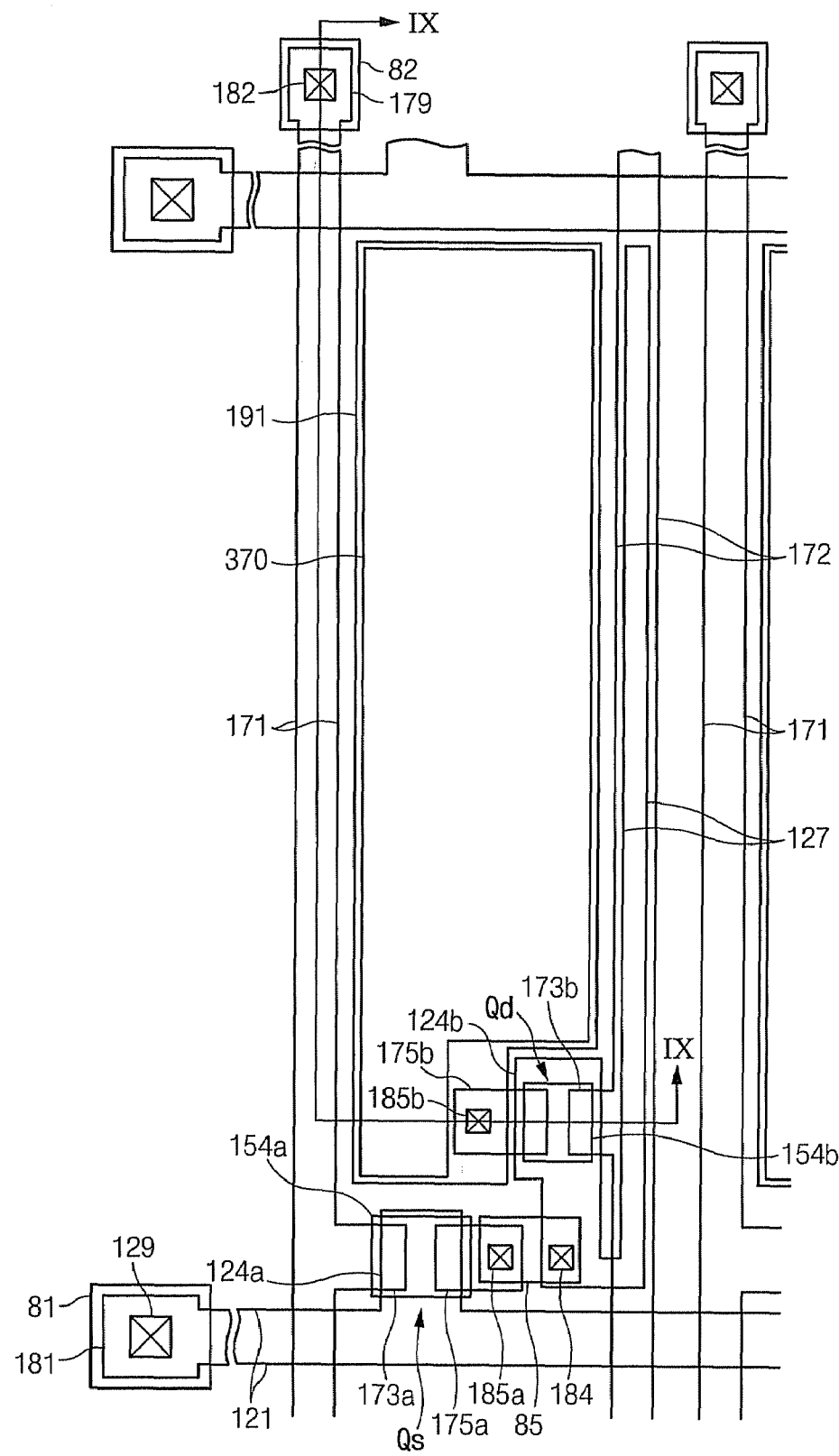
FIG. 8 is a top plan layout view of the exemplary embodiment of an OLED display manufactured using the exemplary inkjet printing system according to the present invention.

FIG. 8 is a plan view layout of an OLED display panel for an OLED display manufactured using an inkjet printing system of FIGS. 1-4 according to an exemplary embodiment of the present invention. FIG. 9 is a cross-sectional view of the organic light emitting diode ("OLED") display panel shown in FIG. 8 taken along line IX-IX.

Figure 9:
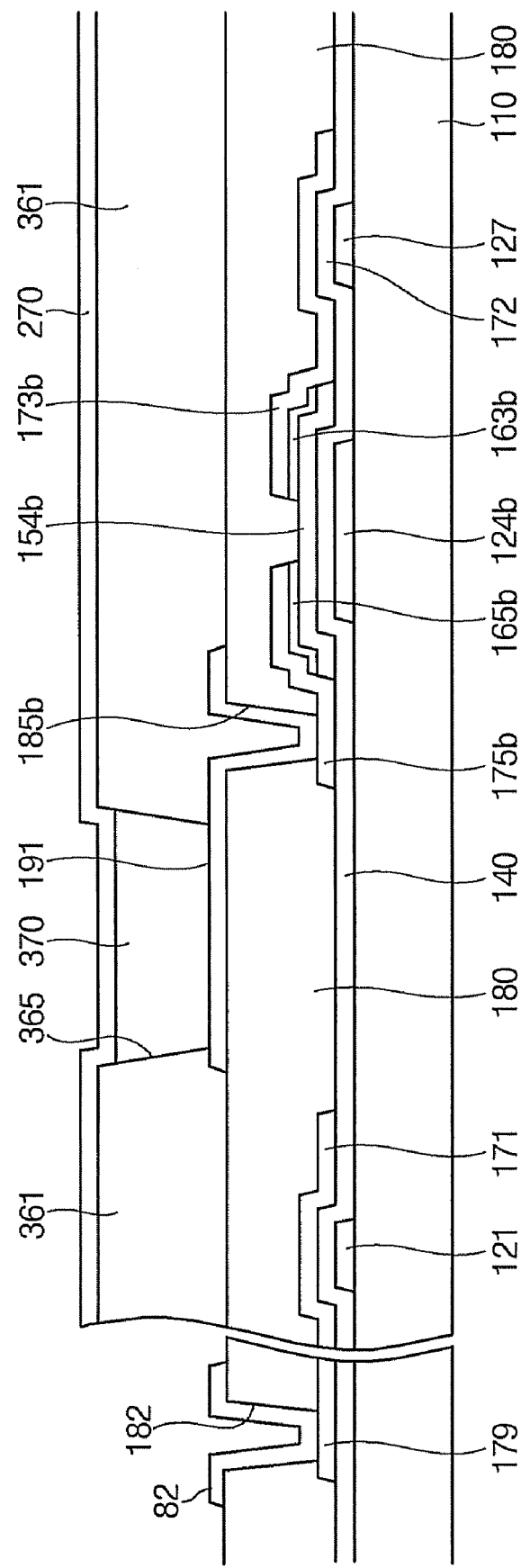
FIG. 9 is a cross-sectional view of the exemplary embodiment of an OLED display manufactured using an exemplary embodiment of an inkjet printing system according to the present invention taken along line IX-IX of FIG. 8.

As shown in FIGS. 8 and 9, a plurality of gate lines 121 having a first control electrode 124a and a plurality of gate conductors having a plurality of second control electrodes 124b are formed on an insulation substrate 110 made of transparent glass or plastic. The gate conductors are formed using the long tubular-shaped nozzles 410 of an exemplary inkjet printing system of FIGS. 1-4 according to an exemplary embodiment of the present invention.

As illustrated in FIG. 8, the gate lines 121 transfer gate signals and extend basically in a horizontal direction. Each of the gate lines 121 includes a wide end 129 for connecting to another layer or an external driving circuit (not shown), and the first control electrodes 124a extend upward from the gate line 121.

The second control electrodes 124b are separated from the gate lines 121 and include storage electrodes 127 that extend downward, bend to the right, and then extend upward, as illustrated in FIG. 8.

The gate conductors 121 and 124b are made of an aluminum (Al) group metal including Al and an Al alloy, a silver (Ag) group metal including Ag and a Ag alloy, a copper (Cu) group metal including Cu and a Cu alloy, a molybdenum (Mo) group metal including Mo and a Mo alloy, chromium (Cr), tantalum (Ta), or titanium (Ti).

A gate insulating layer 140 is formed on the gate conductors 121 and 124b, wherein the gate insulating layer 140 is made of silicon nitride ("SiNx") or silicon oxide ("SiOx").

A plurality of first and second semiconductor islands 154a and 154b are formed on the gate insulating layer 140, wherein the first and second semiconductor islands 154a and 154b are formed of hydrogenated amorphous silicon or polysilicon. The first and the second semiconductor islands 154a and 154b are disposed on the first and second control electrodes 124a and 124b, respectively.

A plurality of pairs of the first ohmic contacts 163a and 165a and a plurality of pairs of the second ohmic contacts 163b and 165b are formed on the first and second semiconductors 154a and 154b, respectively. The ohmic contacts 163a, 163b, 165a and 165b have an island shape and are made of n+ hydrogenated amorphous silicon in which an n-type impurity is heavily doped at a high concentration, or silicide. The first ohmic contacts 163a and 165a form a pair and are disposed on the first semiconductor 154a, and the second ohmic contacts 163b and 165b also form a pair and are disposed on the second semiconductor 154b.

A plurality of data conductors are formed on the ohmic contacts 163a, 163b, 165a and 165b and a gate insulating layer 140, wherein each of the data conductors includes a plurality of data lines 171, a plurality of driving voltage lines 172, and a plurality of first and second output electrodes 175a and 175b. Such data conductors are formed using the long tubular-shaped nozzles 410 of the exemplary inkjet printing system of FIGS. 1-4 according to an exemplary embodiment of the present invention.

With specific reference to FIG. 8, the data lines 171 transfer data signals and extend basically in a vertical direction to cross the gate lines 121. Each of the data lines 171 includes a plurality of first input electrodes 173a that extend toward the first control electrode 124a and a wide end 179 for contacting another layer or an external driving circuit (not shown).

Still referring to FIG. 8, the driving voltage lines 172 transfer driving voltages and extend basically in a vertical direction to cross the gate lines 121. Each of the driving voltage lines 172 includes a plurality of second input electrodes 173b that extend toward the second control electrodes 124b. The driving voltage lines 172 are overlapped with the storage electrodes 127 and may be connected to each other.

The first and second output electrodes 175a and 175b are separated from each other, and are also separated from the data lines 171 and the driving voltage lines 172. The first input electrodes 173a and the first output electrodes 175a face each other with the first control electrodes 124a as a center therebween. The second input electrodes 173b and the second output electrodes 175b face each other with the second control electrodes 124b as a center therebetween.

It is preferable that the data conductors 171, 172, 175a and 175b may be made of a refractory metal such as molybdenum, chromium, tantalum, titanium, and alloys thereof, and the data conductors 171, 172, 175a and 175b may have a multi-layered structure having a refractory metal layer (not shown) and a low-resistive conductive layer (not shown).

The ohmic contacts 163a, 163b, 165a and 165b are disposed only between the semiconductors 154a and 154b and the data conductors 171, 172, 175a and 175b to reduce contact resistance therebetween. The semiconductors 154a and 154b include exposed regions which are not covered with the data conductors 171, 172, 175a and 175b, for example, a region between the input electrodes 173a and 173b and the output electrodes 175a and 175b.

A passivation layer 180 is formed on the data conductors 171, 172, 175a and 175b and the exposed regions of the semiconductors 154a and 154b. The passivation layer 180 is made of an inorganic insulator such as silicon nitride or silicon oxide, an organic insulator, or an insulating material having a low dielectric constant. Also, the passivation layer 180 may have a dual-layered structure composed of a lower inorganic layer and an upper organic layer in order to protect the exposed regions of the semiconductors 154 while providing a merit of an organic layer.

A plurality of contact holes 182, 185a and 185b are formed on the passivation layer 180 to expose the ends 179 of the data lines 171, and the first and second output electrodes 175a and 175b, respectively. Also, a plurality of contact holes 181 and 184 are formed on the passivation layer 180 and the gate insulating layer 140 to expose the ends 129 of the gate lines 121 and the second input electrodes 124b, respectively.

A plurality of pixel electrodes 191, a plurality of connecting members 85, and a plurality of contact assistants 81 and 82 are formed on the passivation layer 180. The pixel electrodes 191, the connecting members 85, and the contact assistants 81 and 82 are made of a transparent conductive material such as ITO or IZO, or a reflective metal such as aluminum, silver, or alloys thereof.

The pixel electrodes 191 are physically and electrically connected to the second output electrodes 175b through the contact holes 185b. The connecting members 85 are connected to the second control electrodes 124b and the first output electrodes 175a through the contact holes 184 and 185a.

The contact assistants 81 and 82 are connected to the ends 129 of the gate lines 121 and the ends 179 of the data lines 171 through the contact holes 181 and 182, respectively. The contact assistants 81 and 82 enhance the connectivity between the ends 129 of the gate lines 121 and an external device (not shown) or between the ends 179 of the data lines 171 and an external device (not shown), and protect them.

A partition 361 is formed on the passivation layer 180. The partition 361 defines an opening 365 by surrounding the edge of the pixel electrode 191 akin to a bank, and is made of an organic insulator or an inorganic insulator. Also, the partition 361 may be made of a photoresist having a black pigment. In this case, the partition 361 functions as a light blocking member and its forming process is simple.

An organic light emitting member 370 formed by the inkjet printing system according to an exemplary embodiment of the present invention is disposed in the opening 365 defined by the partition 361 on the pixel electrode 191. The organic light emitting members 370 are made of an organic material which emits light in one of three primary colors such as red, green, and blue, or example. An organic light emitting diode ("OLED") display displays images as a spatial sum of primary colors emitted from the organic light emitting members 370.

The organic light emitting members 370 may have a multilayered structure including an emitting layer (not shown) for emitting light and an auxiliary layer (not shown) for improving the light emitting efficiency of the emitting layer. The auxiliary layer may be electron and hole transport layers (not shown) for balancing electrons and holes, and electron and hole injecting layers (not shown) for enhancing the injection of the electrons and holes, respectively.

A common electrode 270 is formed on the organic light emitting members 370. The common electrode 270 receives a common voltage Vss, and is made of a reflective metal such as Ca, Ba, Mg, Al, and Ag, or a transparent conductive material such as ITO or IZO.

In such an organic light emitting diode ("OLED") display, the first control electrode 124a connected to the gate line 121, the first input electrode 173a connected to the data line 171, and the first output electrode 175a form a switching thin film transistors Qs together with the first semiconductor 154a. The channel of the switching thin film transistor Qs is formed at the first semiconductor 154a between the first input electrode 173a and the first output electrode 175a. The second control electrode 124b connected to the first output electrode 175a, the second input electrode 173b connected to the driving voltage line 172, and the second output electrode 175b connected to the pixel electrode 191 forming a driving thin film transistor Qd together with the second semiconductor 154b. The channel of the driving thin film transistor Qd is formed at the second semiconductor 154b between the second input electrode 173b and the second output electrode 175b. The pixel electrode 191, the organic light emitting member 370 and the common electrode 270 form an organic light emitting diode ("OLED") LD. The pixel electrode 191 becomes an anode, and the common electrode 270 becomes a cathode. Alternatively, the pixel electrode 191 becomes a cathode, and the common electrode 270 becomes an anode. The storage electrode 127 and driving voltage line 172 which overlap each other form a storage capacitor Cst.

Such an organic light emitting diode ("OLED") display displays images by emitting light upward and downward from the substrate 110. The opaque pixel electrode 191 and the transparent common electrode 270 are applied to a top emission mode OLED display that displays images upward from the substrate 110. The transparent pixel electrode 191 and the opaque common electrode 270 are applied to a bottom emission mode OLED display that displays downward from the substrate 110.

Meanwhile, if the semiconductors 154a and 154b are polysilicon, an intrinsic region (not shown) facing the control electrodes 124a and 124b and extrinsic regions (not shown) disposed at both sides of the intrinsic region are included. The extrinsic regions are electrically connected to the input electrodes 173a and 173b and the output electrodes 175a and 175b, and the ohmic contacts 163a, 163b, 165a and 165b may be omitted.

Also, the control electrodes 124a and 124b may be disposed on the semiconductors 154a and 154b. In this case, the gate insulating layer 140 is also disposed between the semiconductors 154a and 154b and the control electrodes 124a and 124b. Herein, the data conductors 171, 172, 173b and 175b are disposed on the gate insulating layer 140, and may be electrically connected to the semiconductors 154a and 154b through contact holes (not shown) formed on the gate insulating layer 140. Alternatively, the data conductors 171, 172, 173b and 175b may be electrically contacted to the semiconductors 154a and 154b by being disposed under the semiconductors 154a and 154b.

The inkjet printing system according to an exemplary embodiment of the present invention and the method of manufacturing a display device using the same can form a thin film having a fine width by dripping fine ink drops through long tubular-shaped nozzles that have fine holes formed on inner surfaces thereof.

Also, each nozzle 410 has a tapering end 410a in order to not be smeared with the ink 5 even if the concentration of the ink 5 is low, and the size and direction of the ink drops can be uniformly maintained. Therefore, the above features make it possible to form a thin film having a uniform profile and thickness.

While this invention has been described in connection with what is presently considered to be practical exemplary embodiments, it is to be understood that the present invention is not limited to the disclosed exemplary embodiments, but, on the contrary, is intended to cover various modifications and equivalent arrangements included within the spirit and scope of the appended claims.

What is claimed is:

1. An inkjet printing system comprising:
   a stage configured for mounting a substrate thereon;
   a head unit which drips ink onto the substrate; and
   a moving device which moves the head unit to predetermined positions,
   wherein the head unit includes an inkjet head and a plurality of nozzles, each of the nozzles having a long tubular shape and extending away from a bottom surface defining an outside surface of the inkjet head.

2. The inkjet printing system of claim 1, wherein an inner surfaces of each of the tubular shaped nozzles defines a corresponding fine passageway to pass the ink therethrough.

3. The inkjet printing system of claim 2, wherein each of the nozzles has a tapering end.

4. The inkjet printing system of claim 3, wherein the tubular shaped nozzles are made of carbon nanotubes.

5. The inkjet printing system of claim 3, wherein diameters of the nozzles are in a range from about 1 nanometer to about hundreds of nanometers.

6. The inkjet printing system of claim 2, wherein the substrate is a substrate for a liquid crystal display (LCD) or an organic light emitting diode (OLED) display.

7. The inkjet printing system of claim 6, wherein the ink is at least one selected from among ink for color filters, ink for organic light emitting members and ink for metal wiring.

8. The inkjet printing system of claim 7, wherein a partition member is formed on the substrate to confine the dripped ink.

9. The inkjet printing system of claim 8, wherein the partition member is a light blocking member of the LCD or a partition of the OLED display.

10. The inkjet system of claim 7, wherein the ink for metal wiring is ink for at least one of metal wiring selected from among gate lines, storage electrode lines and data lines.

11. A method of manufacturing a display device, the method comprising:
disposing a head unit including an inkjet head and a plurality of nozzles on a substrate; and
dripping ink onto the substrate through the nozzles of the inkjet head while moving the head unit,
wherein each of the nozzles has a long tubular shape and extends away from a bottom surface defining an outside surface of the inkjet head.

12. The method of claim 11, wherein an inner surfaces of each of the tubular shaped nozzles defines a fine passagewayto pass the ink therethrough.

13. The method of claim 12, wherein each of the nozzles has a tapering end.

14. The method of claim 13, wherein the tubular nozzles are made of carbon nanotubes.

15. The method of claim 12, wherein diameters of the nozzles are in a range from about 1 nanometer to about hundreds of nanometers.

16. The method of claim 12, wherein the substrate is a substrate for an LCD or an OLED display.

17. The method of claim 16, wherein the ink is at least one selected from among ink for color filters, ink for organic light emitting members and ink for metal wiring.

18. The method of claim 17, wherein a partition member is formed on the substrate to confine the dripped ink.

19. The method of claim 18, wherein the partition member is a light blocking member of the LCD or a partition of the OLED display.

20. The method of claim 17, wherein the ink for metal wiring is ink for at least one of metal wiring selected from among gate lines, storage electrode lines, and data lines.

* * * * *